United States Patent [19]

Fredberg

[11] 4,029,628
[45] June 14, 1977

[54] BONDING MATERIAL FOR PLANAR ELECTRONIC DEVICE

[75] Inventor: Marvin I. Fredberg, Stoughton, Mass.

[73] Assignee: The United States of America as represented by the Secretary of the Navy, Washington, D.C.

[22] Filed: May 22, 1974

[21] Appl. No.: 472,404

[52] U.S. Cl. ............... 260/32.8 R; 260/32.8 A; 260/32.8 N; 260/32.8 SB; 260/32.8 EP; 428/901
[51] Int. Cl.² .......................................... C08K 5/07
[58] Field of Search ............ 252/71; 260/32.8 R, 260/32.8 NA, 32.8 SB, 32.8 EP; 428/901

[56] References Cited

UNITED STATES PATENTS

| 2,721,153 | 10/1955 | Hopf et al. | 428/901 |
| 3,384,679 | 5/1968 | Stetz | 260/32.8 N |
| 3,405,066 | 10/1968 | McGhee et al. | 252/71 |
| 3,625,758 | 12/1971 | Stahl et al. | 428/901 |
| 3,703,568 | 11/1972 | Kadowaki et al. | 260/890 |

Primary Examiner—Allan Lieberman
Attorney, Agent, or Firm—R. S. Sciascia; A. L. Branning; H. B. Field

[57] ABSTRACT

A composition for bonding integrated circuits to a heat sink and conducting heat therebetween. The composition is comprised of a thermoplastic polymer resin adhesive for supplying the bonding strength, a solvent for softening the adhesive to a putty like substance, and a filler for increasing the thermal conductivity of the adhesive.

2 Claims, No Drawings

BONDING MATERIAL FOR PLANAR ELECTRONIC DEVICE

BACKGROUND OF THE INVENTION

Integrated circuits in planar electronic packages, otherwise known as flatpacks, produce significant quantities of heat which must be removed to maintain reliable operation. This requires a low temperature rise between the junction of the device and the heat sink. A major mode of heat transfer in many designs is conduction through the device package to a printed circuit board. Since the thermal resistance at the board/package interface is directly in series with heat flow, large temperature differences are possible between the board and the flatpack. The need, therefore, is to minimize thermal resistance at the component board interface, thus lowering the component temperature by permitting free transfer of heat.

Present methods of providing a thermal path include the use of double-sided tapes, silicone greases, epoxies, silicone rubbers, and other thermal compounds.

The double sided tapes are not conductive and thus, to permit heat transfer, the tapes must be placed so that they do not fill the entire space between the device and the board. Silicone grease, as well as many other compounds, cannot withstand the necessary chemical cleaning. Triclorethane, a common PC board cleaner, dissolves most of the non-curing materials tested. In addition, the accidental exposure of a solder pad to silicone has adverse effects on solderability.

Epoxies can provide a good thermal path, but installation is permanent. The component cannot be removed without damaging the board, the device, or both. Silicone rubber provides a rather poor path due to low thermal conductivity. Repair, while not as difficult as epoxy is not an easy production.

SUMMARY OF THE INVENTION

An adhesive composition comprising a thermoplastic polymer resin, a solvent, and a thermally conductive filler is used to secure integrated circuits to a heat sink, such as a printed circuit (PC) board. The composition is characterized by low thermal resistance so that the heat produced by the integrated circuit is thermally conducted through the adhesive to the heat sink.

OBJECTS OF THE INVENTION

It is therefor an object of the invention to conduct heat from an integrated circuit to a heat sink through an adhesive which is non curing for ease of repair, inert to chemicals used in printed circuit (PC) board manufacture and cleaning, consistent with the thermal design of planar electronic packages, and compatible with general coating and soldering techniques.

Another object is to provide an improved hot melt adhesive composition which is: a dielectric, has low thermal resistance, is inert to chemicals used in printed circuit board manufacture, and has the consistency of a putty.

Other objects, advantages and novel features of the present invention will become apparent from the following detailed description of the invention.

DETAILED DESCRIPTION

The objects of the present invention are achieved by modifying a thermoplastic polymer adhesive which normally cures to a brittle, ceramic-like substance. A solvent or flexibilizer is added to the adhesive in its melted or fluid state resulting in a composition which remains the consistency of a putty when cooled, instead of reverting to its original form. A filler is also added to increase the thermal conductivity of the adhesive. The amount of filler added is controlled so that the putty like consistency is not lost.

The following is an example of a preferred composition and method of using it.

EXAMPLE

A composition is made consisting of three parts by weight of a thermoplastic polymer adhesive, three parts solvent, and two parts filler. The adhesive consists of Aremco crystal bond 509 which is heated to a melting temperature of approximately 200° F. "Crystalbond" is a registered trademark of Aremco Products, Inc., P.O. Box 145, Briarcliff Manor, N.Y. 10510. "Crystalbond 509" is a thermoplastic polymer having excellent adhesive properties, a softening point of 160° F, a flow point of 275° F and a viscosity at the flow point of 6,000 cps. "Crystalbond 509" is clear amber in color and soluble in acetone. The chemical composition of "Crystalbond 509" is maintained as a trade secret by its producer. However, it has been readily obtainable from Aremco since 1972, and should the composition be changed, the designation "509" would also be changed. A methyl ethyl ketone (MEK) solvent, and an alumina filler are then added to the melted adhesive. The resulting material is a thick, light grey putty-like substance which can be applied to the board. The specific proportions of each of the elements can be varied by 5 percent without appreciably changing the resulting composition. The proportion of filler has been varied up to about 80% by weight of the composition but this changes the tacky texture of the composition.

The composition can be applied to the board as follows: The composition is rolled, sprayed, extruded, or otherwise formed into sheets of the desired thickness. The sheets are diced or cut to the proper size. The component to be bonded is placed on the board sandwiching the material with slight pressure. Optionally, the board may be heated to 150° F to insure instant wetting action at the interface. If heat is not applied, a bond will occur in a short time after manufacture. The module is then soldered and coated as usual.

The alumina filler decreases the resistance of the bulk material. The resistance at the interface of the board with the surface of the flatpack is also reduced by the texture of the adhesive which is fluent so that it fills the entire space at the interface and wets the board and surface of the flatpack. Calculations show a 5° C/watt resistance of the bulk material and a 2.5° C/watt resistance at each interface giving a total resistance of 10° C/watt. Flatpacks exhibit a 50° C/watt resistance from the junction to the surface of the case, therefore the series thermal resistance from the flatpack to the circuit board can be significantly reduced.

No change in the material was found after three months at room temperature. Samples remained at 150° F for 24 hours with no effects. 20 flatpacks were bonded to PC boards and then conformally coated. All flatpacks were removed easily with no damage to the device or the board. Impressions and shearing of material demonstrated the wetting and adhesion of the material.

The following features of the invention were confirmed. Since the material remains soft, it expands and contracts with adjoining materials. Repair is simple since the device is easily removed from the adhesive. Acetone can be used to remove any residue. At room temperature, the pad composition is non-sticky and therefore will not hold dust or dirt which could contaminate during manufacture. Since the pads are non-sticky, they are easily handled so that high production is easily developed. The material is deformable in that it cold flows to fill the entire space under the device. The composition is inert to cleaning solutions such as triclorethane and compatible with usual conformal coatings.

Obviously, many modifications and variations of the present invention are possible in light of the above teachings. It is therefore to be understood that, within the scope of the appended claims, the invention may be practiced otherwise than as specifically described.

What is claimed is:

1. A composition for bonding integrated circuits to a heat sink and providing an improved thermal conduction path therebetween, said composition consisting essentially of from 2.85 to 3.15 parts by weight of an adhesive thermoplastic polymer for bonding said integrated circuit to said heat sink, said polymer having a softening point of 160° F, a flow point of 275° F,
   a viscosity at said flow point of 6,000 cps, a clear amber color, and said polymer being soluble in acetone; from 2.85 to 3.15 parts by weight of a methyl ethyl ketone solvent for softening said polymer to a putty like substance; and
   from 1.90 to 2.10 parts by weight of
   an alumina filler for increasing the thermal conductivity of said composition for bonding integrated circuits.

2. The composition of claim 1 consisting essentially of three parts by weight of said thermoplastic polymer, three parts by weight of said solvent, and two parts by weight of said filler.

* * * * *